(12) United States Patent
Osawa et al.

(10) Patent No.: US 8,039,954 B2
(45) Date of Patent: Oct. 18, 2011

(54) BIDIRECTIONAL SWITCH MODULE

(75) Inventors: Michitaka Osawa, Fujisawa (JP);
Takamitsu Kanazawa, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/773,305

(22) Filed: May 4, 2010

(65) Prior Publication Data

US 2010/0213510 A1     Aug. 26, 2010

Related U.S. Application Data

(63) Continuation of application No. 11/965,808, filed on Dec. 28, 2007, now Pat. No. 7,750,463.

(30) Foreign Application Priority Data

Dec. 28, 2006  (JP) .................................. 2006-353699

(51) Int. Cl.
*H01L 29/66* (2006.01)
(52) U.S. Cl. ................. 257/723; 257/712; 257/E29.242
(58) Field of Classification Search .................. 327/434; 257/133, 712, 723, E29.242
See application file for complete search history.

(56) References Cited

U.S. PATENT DOCUMENTS

| 5,608,237 | A | 3/1997 | Aizawa et al. |
| 5,767,573 | A | 6/1998 | Noda et al. |
| 6,424,035 | B1 | 7/2002 | Sapp et al. |
| 7,242,078 | B2 | 7/2007 | O'Shea et al. |
| 7,525,183 | B2 | 4/2009 | O'Shea et al. |
| 7,547,964 | B2 | 6/2009 | Pavier et al. |
| 7,598,605 | B2 | 10/2009 | Akiyama et al. |
| 2002/0096748 | A1 | 7/2002 | Pavier |
| 2004/0095729 | A1 | 5/2004 | Vaysse et al. |
| 2004/0188706 | A1 | 9/2004 | Chang et al. |
| 2005/0133902 | A1 | 6/2005 | Pavier et al. |

FOREIGN PATENT DOCUMENTS

| JP | 7 307469 | 11/1995 |
| JP | 8-032060 | 2/1996 |
| JP | 10-163416 | 6/1998 |
| JP | 2001-45772 | 2/2001 |
| JP | 2001-358244 | 12/2001 |
| JP | 2005-316360 | 11/2005 |
| JP | 2005310907 | 11/2005 |

OTHER PUBLICATIONS

Office Action in JP 2006-353699, pp. 1-2, in Japanese, Dec. 24, 2008.
European Search Report, dated Feb. 2, 2010.
Office Action in Japanese Patent Application 2009-039134, dated Apr. 26, 2011 (in Japanese, 2 pgs.) (and English language translation, 2 pgs.).

*Primary Examiner* — Roy K Potter
(74) *Attorney, Agent, or Firm* — Antonelli, Terry, Stout & Kraus, LLP.

(57) ABSTRACT

A first semiconductor element having a junction electrode to be connected to a first node of a bidirectional switch circuit is mounted on a first metal base plate to be a heat dissipation plate, and a second semiconductor element having a junction electrode to be connected to a second node of the bidirectional switch circuit is mounted on a second metal base plate to be a heat dissipation plate. The junction electrode of the first semiconductor element has the same potential as that of the first metal base plate, and the junction electrode of the second semiconductor element has the same potential as that of the second metal base plate. Also, the respective metal base plates and non-junction electrodes of the respective semiconductor elements are connected by metal thin wires, respectively, thereby configuring the bidirectional switch circuit.

49 Claims, 12 Drawing Sheets

BIDIRECTIONAL SWITCH MODULE

CROSS-REFERENCE TO RELATED APPLICATION

The application is a continuation of U.S. application Ser. No. 11/965,808, filed Dec. 28, 2007, now U.S. Pat. No. 7,750, 463, and which application claims priority from Japanese Patent Application No. JP 2006-353699 filed on Dec. 28, 2006, the contents of which are hereby incorporated by reference into this application.

BACKGROUND OF THE INVENTION

The present invention relates to a power semiconductor module obtained by combining several power semiconductor chips such as diodes, transistors and the like. More particularly, it relates to a bidirectional switch module that can supply electric current bidirectionally.

In electric power conversion devices such as an inverter that inverts DC voltage obtained by rectifying and smoothing AC power source to convert it into AC of an arbitrary frequency and a matrix converter that directly converts AC of a certain frequency into an arbitrary frequency, a bidirectional switch that can supply electric current bidirectionally is used (for example, Japanese Patent Application Laid-Open Publication No. 2001-45772 (Patent Document 1)). Further, also in a flat display apparatus (hereinafter, referred to as "plasma display apparatus") using an AC plasma display panel (hereinafter, abbreviated as "PDP"), a bidirectional switch is used in its power recovery circuit (for example, Japanese Patent Application Laid-Open Publication No. 2005-316360 (Patent Document 2)).

In the apparatus using the bidirectional switch mentioned above (for example, plasma display apparatus), from the viewpoint of cost reduction by shortening the manufacturing man-hours and reducing the substrate size, the modularization of the bidirectional switch has been desired.

The power semiconductor module technologies used in modularizing the bidirectional switch and others are disclosed in, for example, Japanese Patent Application Laid-Open Publication No. 10-163416 (Patent Document 3) and Japanese Patent Application Laid-Open Publication No. 2001-358244 (Patent Document 4).

SUMMARY OF THE INVENTION

Incidentally, as described in Patent Documents 3 and 4, the conventional power semiconductor module is generally constituted of a metal base plate that diffuses heat generated in a semiconductor element, a wiring layer on which a wiring pattern for mounting a semiconductor element chip thereon is formed, and an insulating substrate that insulates the wiring layer and the metal base plate. As the insulating substrate, a ceramic substrate made of, for example, alumina and aluminum nitride, a resin insulating layer made of, for example, an epoxy resin and others are known.

When the conventional module technology in which the semiconductor element chips are mounted on the wiring layer via an insulating substrate is applied to a bidirectional switch circuit with a small number of semiconductor elements, since the insulating substrate and the wiring layer formed thereon are used, the cost increase is caused. Further, when an insulating substrate of an inexpensive resin insulating layer is used in order to reduce the cost, since the heat conductivity thereof is lower than that of a ceramic substrate, the dissipation effect of heat generated in the semiconductor elements deteriorates.

The present invention has been made in consideration of the problems mentioned above, and accordingly, an object of the present invention is to provide a technology capable of reducing the cost while maintaining preferable heat conductivity.

A bidirectional switch module according to the present invention for achieving the above-mentioned object is a bidirectional switch module having a bidirectional switch circuit in which a plurality of semiconductor elements are combined and a current can flow bidirectionally, the bidirectional switch module comprising: at least one or more metal base plates to be heat dissipation plates; a first semiconductor element having a junction electrode to be connected to a first node of the bidirectional switch circuit and mounted on the metal base plate; and a second semiconductor element having a junction electrode to be connected to a second node of the bidirectional switch circuit and mounted on the metal base plate, wherein the junction electrodes of the first and second semiconductor elements have the same potential as that of the metal base plate, and the metal base plate and non-junction electrodes of the semiconductor elements are respectively connected by metal thin wires, thereby constituting the bidirectional switch circuit.

Thus, according to the present invention, the metal base plate is constituted of one or more metal base plates, and semiconductor elements constituting a bidirectional switch circuit and having junction electrodes of the same potential connected to each of the nodes are directly mounted via the junction electrodes on the respective metal base plates corresponding to each of the nodes, thereby realizing the bidirectional switch circuit. Accordingly, without using the conventional module technologies in which the semiconductor element chips are mounted on the wiring layer via an insulating substrate, a plurality of semiconductor elements constituting the bidirectional switch circuit can be mounted on a plurality of metal base plates.

As described above, according to the present invention, since an insulating substrate and a wiring layer are not used, it is possible to reduce the cost. Further, since no insulating substrate is provided, heat conductivity is improved, and the reliability of semiconductor elements is enhanced.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols in all the drawings, and the repetitive description thereof is omitted.

A bidirectional switch module according to an embodiment of the present invention is characterized in that semiconductor elements are directly mounted on a metal base plate serving as a heat dissipation plate without using an insulating substrate and a wiring layer having a wiring pattern formed thereon. In this case, since the metal base plate and the semiconductor element are directly electrically connected, the metal base plate has the potential equal to that of the junction electrode of the semiconductor element connected to the metal base plate. Therefore, the metal base plate is constituted of at least one or more metal base plates, and a plurality of semiconductor elements having junction electrodes of the same potential are mounted on each of the metal base plates. Then, the respective semiconductor elements are connected by metal thin wires (for example, bonding wires), so that a bidirectional switch circuit is configured as a whole.

Figure 1A:
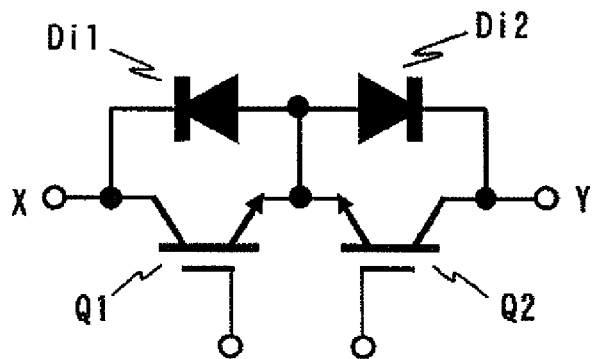
FIG. 1A is a diagram showing a circuit configuration of a bidirectional switch according to the present invention.
Figure 1B:
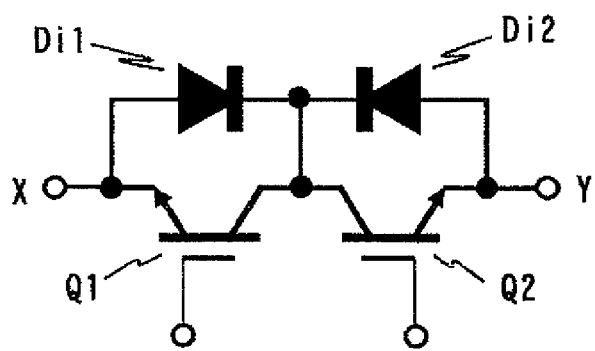
FIG. 1B is a diagram showing another circuit configuration of a bidirectional switch according to the present invention.
Figure 1C:
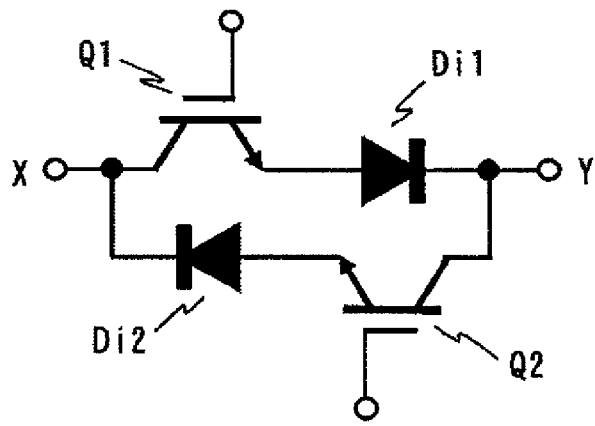
FIG. 1C is a diagram showing another circuit configuration of a bidirectional switch according to the present invention.
Figure 1D:
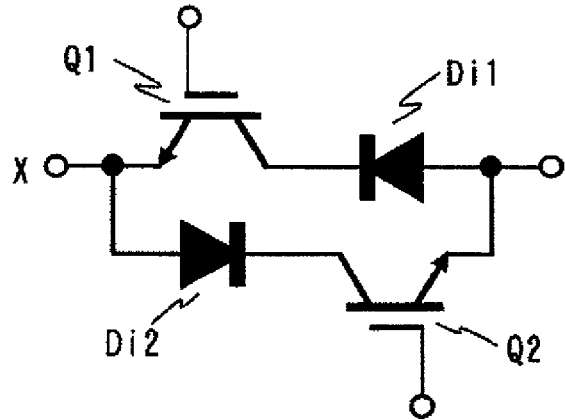
FIG. 1D is a diagram showing another circuit configuration of a bidirectional switch according to the present invention.

FIG. 1A to FIG. 1D show circuit configurations of the bidirectional switches according to the embodiments of the present invention. As shown in FIG. 1A to FIG. 1D, the bidirectional switch includes a first semiconductor switch Q1, a second semiconductor switch Q2, a first diode Di1, and a second diode Di2 connected between both the ends (X terminal and Y terminal) of the switch. Also, depending on the combination structure of these semiconductor elements, the bidirectional switch can be roughly divided into two groups. The one is a first group in which the first semiconductor switch Q1 and the second semiconductor switch Q2 with inverse polarities are connected in series (hereinafter, referred to as "inverse-series connection"), and the diodes with inverse polarities are connected in parallel to the respective semiconductor switches (hereinafter, referred to as "inverse-parallel connection") as shown in FIG. 1A and FIG. 1B. Note that the bidirectional switch of FIG. 1B has the configuration in which the directions of the semiconductor elements in the bidirectional switch of FIG. 1A are inverted. The other is a second group in which the first semiconductor switch Q1 and the first diode with the same polarity are connected in series (hereinafter, referred to as "normal-series connection"), and the second semiconductor switch Q2 and the second diode in the normal-series connection with the polarity inverse to that of the first semiconductor switch Q1 and the first diode are connected in parallel to the first semiconductor switch Q1 and the first diode as shown in FIG. 1C and FIG. 1D. Note that the bidirectional switch of FIG. 1D has the configuration in which the directions of the semiconductor elements in the bidirectional switch of FIG. 1C are inverted.

Hereinafter, the modularization of the respective circuits according to the embodiments of the present invention will be described. Although the descriptions will be made below based on the case of using an IGBT (Insulated Gate Bipolar Transistor) as the semiconductor switch, the present invention is not limited to this, and an MOSFET (Metal Oxide Semiconductor Field Effect Transistor) or a transistor may be employed. In addition, in the case where an IGBT is replaced with, for example, a MOSFET, a collector electrode C corresponds to a drain electrode D, and an emitter electrode E corresponds to a source electrode S.

First Embodiment

First, the bidirectional switch of FIG. 1A will be described.

Figure 2:
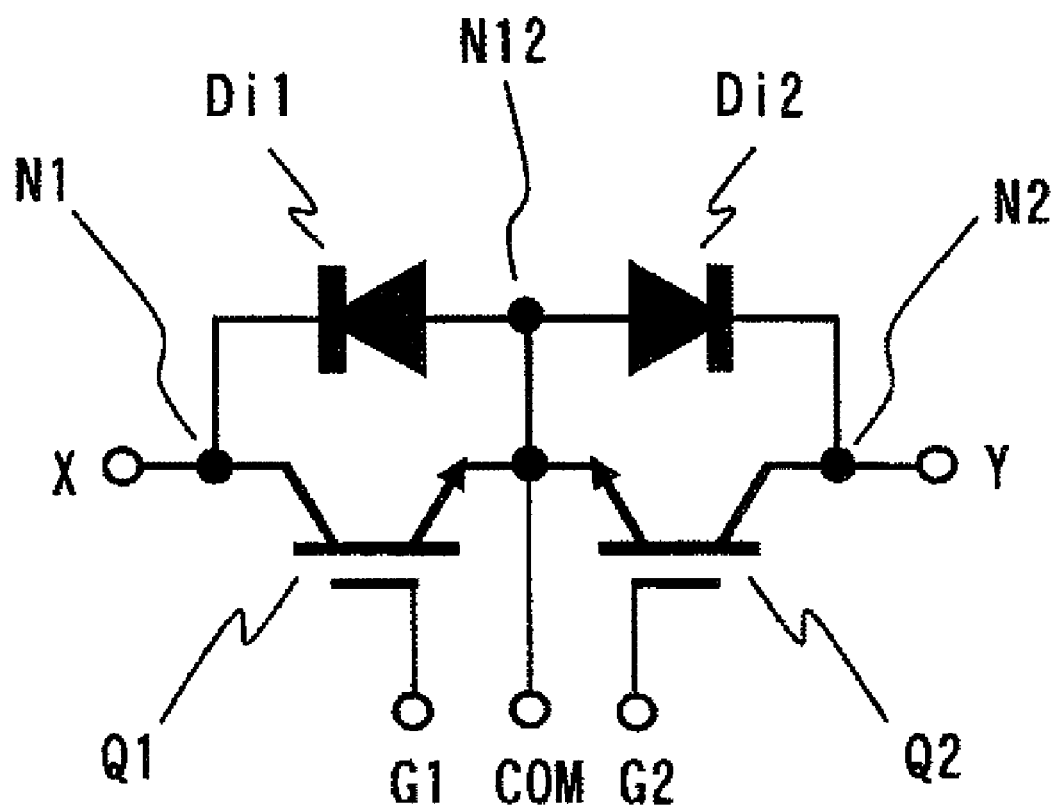
FIG. 2 is a circuit diagram of a bidirectional switch according to a first embodiment of the present invention.

FIG. 2 is a diagram showing the circuit of the bidirectional switch according to the first embodiment, in which FIG. 1A is shown again.

As shown in FIG. 2, in the bidirectional switch according to the present embodiment, between the X and Y terminals, the first semiconductor switch Q1 on the X terminal side and the second semiconductor switch Q2 are disposed in the inverse-series connection by their emitter electrodes, and the first diode Di1 and the second diode Di2 are disposed in the inverse-parallel connection with the semiconductor switches Q1 and Q2, respectively.

In order to control the semiconductor switches, the gate electrode G of the first semiconductor switch Q1, the gate electrode G of the second semiconductor switch Q2, and emitter electrodes E of the first semiconductor switch Q1 and the second semiconductor switch Q2 are extended to the outside and connected to a G1 terminal, a G2 terminal, and a COM terminal, respectively.

Herein, for simplifying the following descriptions, the connection point (intersection point) of the circuit elements is referred to as a node. Namely, the connection point of the collector electrode C of the first semiconductor switch Q1 and the cathode electrode K of the first diode Di1 is defined as a node N1, the connection point of the collector electrode C of the second semiconductor switch Q2 and the cathode electrode K of the second diode Di2 is defined as a node N2, and the connection point of the first semiconductor switch Q1 and the second semiconductor switch Q2 is defined as a node N12.

Note that the IGBT is used here as the semiconductor switches Q1 and Q2. In the case of using, for example, a vertical MOSFET in place of the IGBT, since parasitic diodes in the inverse-parallel connection are formed, there is no need to dispose the diodes Di1 and Di2 in the inverse-parallel connection outside the semiconductor element.

Since the operation of the bidirectional switch is well-known, the operation outline thereof will be only described briefly.

When a current is supplied from the X terminal to the Y terminal, a switch drive signal (not shown) is given between G1 and the COM terminal and the first semiconductor switch Q1 is turned on. Then, the current flows from the X terminal side to the first semiconductor switch Q1 and to the second diode Di2, and is outputted from the Y terminal. On the contrary, when a current is supplied from the Y terminal to the X terminal, a switch drive signal (not shown) is given between G2 and the COM terminal and the second semiconductor switch Q2 is turned on. Then, the current flows from the Y terminal side to the second semiconductor switch Q2 and to the first diode Di1, and is outputted from the X terminal. In this manner, the switch operation is carried out bidirectionally.

Next, prior to the description of the principal part of the present embodiment, the junction electrode of the semiconductor element in the case where the semiconductor element is directly mounted on the metal base plate serving as a heat dissipation plate will be described with reference to FIG. 3.

Figure 3A:
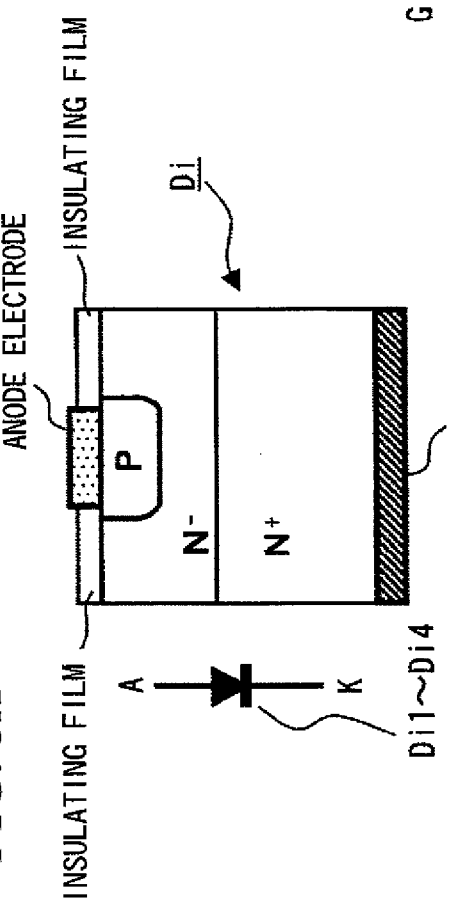
FIG. 3A is a configuration diagram schematically showing a cross section of a semiconductor element constituting a bidirectional switch.
Figure 3B:
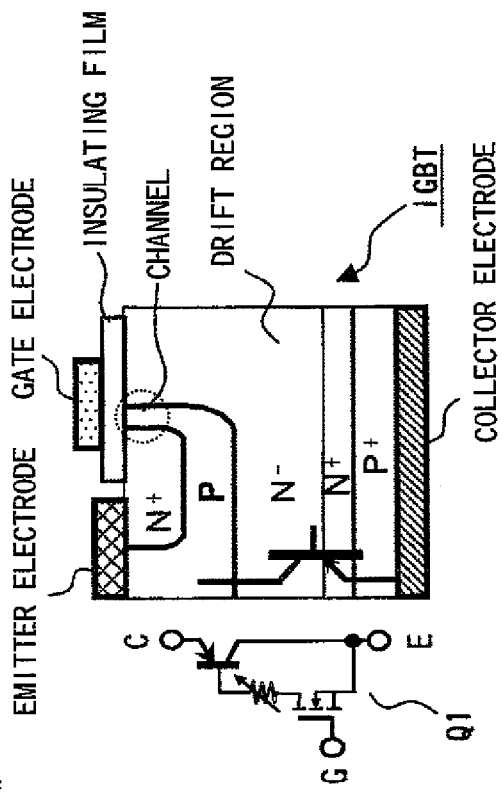
FIG. 3B is a configuration diagram schematically showing a cross section of a semiconductor element constituting a bidirectional switch.
Figure 3C:
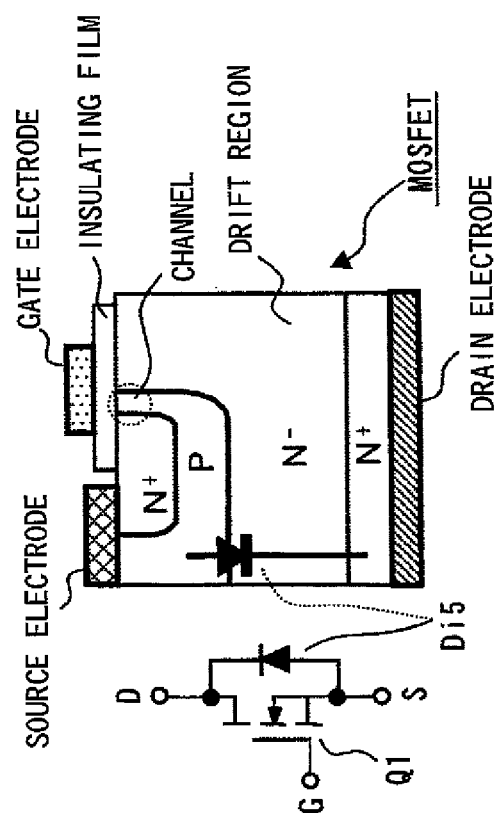
FIG. 3C is a configuration diagram schematically showing a cross section of a semiconductor element constituting a bidirectional switch.

FIG. 3A to FIG. 3C are configuration diagrams schematically showing the cross sections of semiconductor elements constituting a bidirectional switch. FIG. 3A is a configuration diagram of a diode, FIG. 3B is a configuration diagram of a vertical MOSFET, and FIG. 3C is a configuration diagram of an IGBT. Since the operation principle of these semiconductor elements is well-known, the description thereof is omitted here.

As is apparent from FIG. 3A to FIG. 3C, the cathode electrode K of the diode is formed on the entire surface of one end surface of a diode chip, and the anode electrode A is locally formed on the other end surface thereof. Further, the drain electrode D of the vertical MOSFET is formed on the entire surface of one end surface of the chip, and the source electrode S and the gate electrode G are locally formed on the other end surface thereof. Furthermore, similarly, the collector electrode C of the IGBT is formed on the entire surface of one end surface of the chip, and the emitter electrode E and the gate electrode G are locally formed on the other end surface thereof. Therefore, in general, the metal base plate and the diode are connected on the surface of the cathode electrode K, and the metal base plate and the MOSFET are connected on the surface of the drain electrode D. Moreover, in the case of IGBT, the metal base plate and the IGBT are connected on the surface of the collector electrode C. For the convenience of descriptions, the electrode connected to the metal base plate of the semiconductor element is referred to as "junction electrode" (also referred to as surface electrode). In other words, the junction electrode with the metal base plate is the cathode electrode K in the diode, the drain electrode D in the MOSFET, and the collector electrode C in the IGBT.

Next, the number of metal plates serving as heat dissipation plates will be described.

Incidentally, when modularization in which semiconductor elements are directly mounted on the metal base plate without using the insulating substrate is considered, the metal base plate has the potential equal to that of the junction electrode (for example, cathode electrode K, drain electrode D and collector electrode C) of the semiconductor element to be mounted. Therefore, if the potentials of the junction electrodes of semiconductor elements are different, a number of metal base plates corresponding to the number of different potentials are required. Accordingly, when the semiconductor element and the metal base plate are arranged simply in a one-by-one manner, as is apparent from FIG. 2, four metal base plates are required in the bidirectional switch according to the present embodiment because a total of four semiconductor elements including two diodes and two semiconductor switches are disposed.

Accordingly, the inventors of the present invention have made efforts to reduce the number of metal base plates, and have reduced the number of metal base plates by use of the following circuit characteristics.

More specifically, when attention is paid to the node N1 of the bidirectional switch, both the cathode electrode K (junction electrode) of the first diode Di1 and the collector electrode C (junction electrode) of the first semiconductor switch Q1 connected to the node N1 are on the side of the node N1. Further, both the cathode electrode K (junction electrode) of the second diode Dig and the collector electrode C (junction electrode) of the second semiconductor switch Q2 connected to the node N2 are on the side of the node N2. In other words, when a plurality of semiconductor elements (for example, first semiconductor switch Q1 and first diode Di1) connected to one node (for example, node N1) are connected to the node via the junction electrodes thereof, the semiconductor elements can be mounted on one metal base plate via the junction electrodes thereof (details thereof will be described later with reference to FIG. 4). By this means, it becomes possible to reduce the number of metal base plates to two (in other words, it is possible to optimize the number of metal base plates), and in addition to the effect of using no insulating substrate and conductive layer, the further cost reduction can be achieved.

Next, the principal part of the first embodiment according to the present invention will be described.

Figure 4:
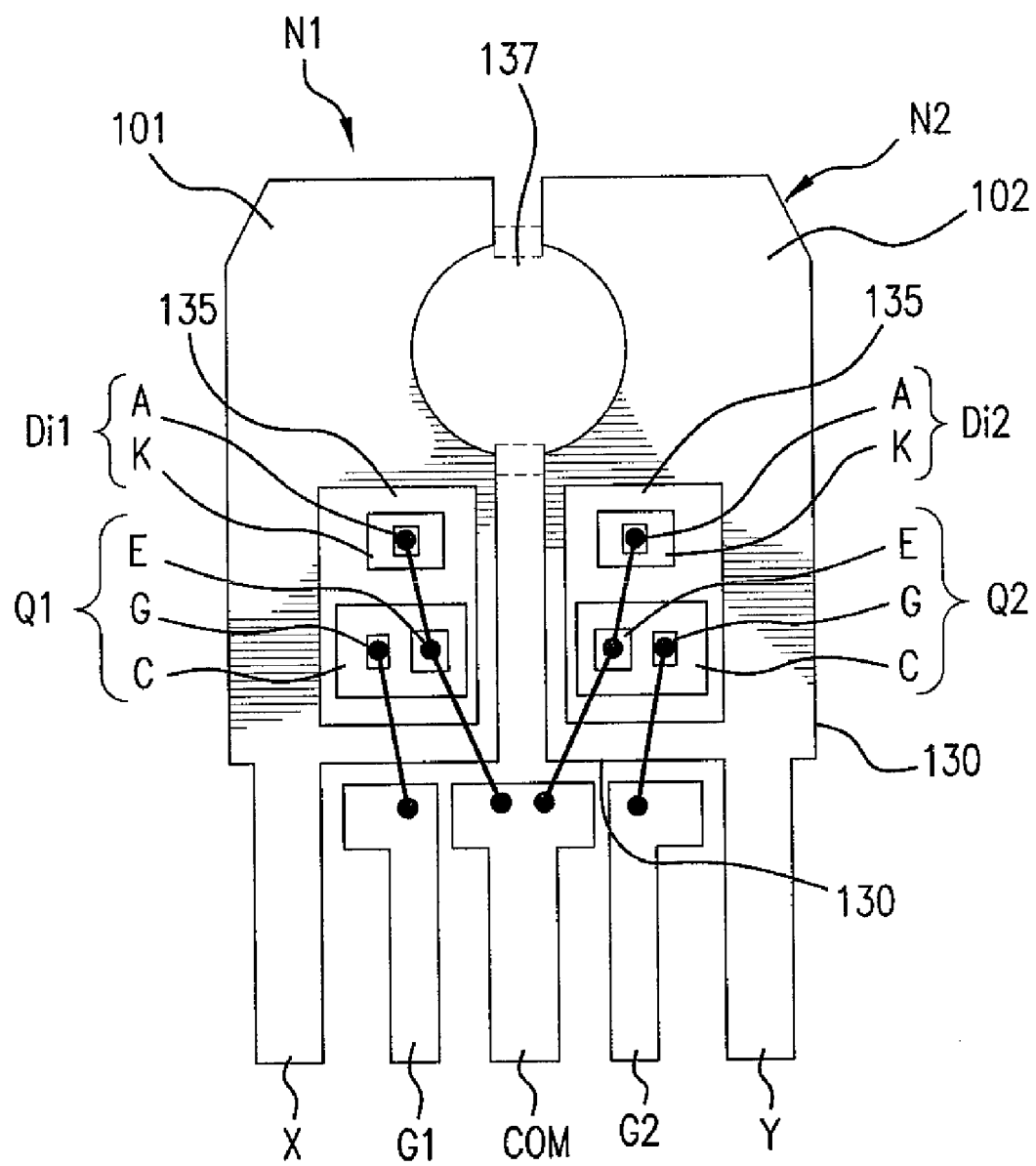
FIG. 4 is a configuration diagram showing a principal part of the bidirectional switch module according to the first embodiment of the present invention.

FIG. 4 is a configuration diagram showing a principal part of the bidirectional switch module according to the first embodiment. In FIG. 4, a bidirectional switch module in which semiconductor elements are mounted on two metal base plates is seen from the side of the semiconductor elements, with a sealing resin being omitted. Further, as the semiconductor switch, an IGBT is used here. It is needless to mention that an MOSFET or a bipolar transistor may be used in place of the IGBT. Note that the bidirectional switch module is packaged into a semiconductor package similar to what is called a TO3P package.

In the bidirectional switch module in FIG. 4, the metal base plates include a first metal base plate 101 that mounts semiconductor elements whose junction electrodes are arranged on the side of the node N1 and has the potential corresponding to the node N1, and a second metal base plate 102 that mounts semiconductor elements whose junction electrodes are arranged on the side of the node N2 and has the potential corresponding to the node N2. Note that, since no semiconductor element whose junction electrode is arranged on the side of the node N12 is connected to the node N12, no metal base plate having the potential corresponding to the node N12 is present.

Specifically, the first semiconductor switch Q1 and the first diode Di1 are mounted on the first metal base plate 101, and the second semiconductor switch Q2 and the second diode Di2 are mounted on the second metal base plate 102. Note that the reference number 135 denotes a mounting area of semiconductor elements.

As is apparent from FIG. 2, the bidirectional switch is provided with X and Y terminals to be current path terminals and G1, G2 and COM terminals for controlling the semiconductor switches Q1 and Q2. Accordingly, as shown in FIG. 4, the first metal base plate 101 having the potential corresponding to the node N1 has the X terminal extended from the chip mounting base, and the second metal base plate 102 having the potential corresponding to the node N2 has the Y terminal extended from the chip mounting base. Since G1, G2 and COM terminals are not connected to the junction electrode, lead terminals to be G1 terminal, G2 terminal and COM terminal are independently provided separately from the metal base plates.

Figure 5:
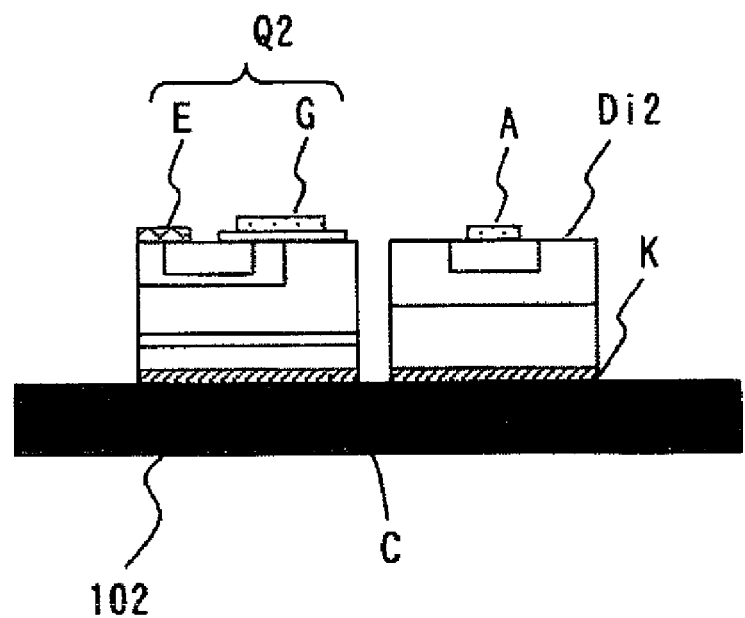
FIG. 5 is a diagram schematically showing the cross section of a second semiconductor switch and a second diode mounted on a second metal base plate in FIG. 4.

FIG. 5 is a diagram schematically showing the cross section of the second semiconductor switch Q2 and the second diode Di2 mounted on the second metal base plate 102 in FIG. 4.

Next, the wiring in the bidirectional switch module will be described. Since the junction electrode of the semiconductor element is jointed and connected to the corresponding metal base plate, the wiring connection of the non-junction electrodes will be mainly described.

In FIG. 4, on the first metal base plate 101 corresponding to the node N1, the first semiconductor switch Q1 and the first diode Di1 are mounted via junction electrodes, respectively. Also, the A (anode) electrode of the first diode Di1 is connected to the E (emitter) electrode of the first semiconductor switch Q1 by a metal thin wire (wire) 130 by use of, for example, the pressure bonding method (bonding or connection by bump), and further, the E (emitter) electrode of the first semiconductor switch Q1 is connected to the COM terminal by a metal thin wire 130. Furthermore, the G (gate) electrode of the first semiconductor switch Q1 is connected to the G1 terminal by a metal thin wire 130.

Similarly, on the second metal base plate 102 corresponding to the node N2, the second semiconductor switch Q2 and the second diode Di2 are mounted via junction electrodes. Also, the A electrode of the second diode Dig is connected to the E electrode of the second semiconductor switch Q2 by a metal thin wire (wire) 130, and further, the E electrode of the second semiconductor switch Q2 is connected to the COM terminal by a metal thin wire 130. Furthermore, the G (gate) electrode of the second semiconductor switch Q2 is connected to the G2 terminal by a metal thin wire 130.

By the connection mentioned above, the circuit of the bidirectional switch shown in FIG. 2 is configured. After a plurality of semiconductor elements are connected by wires, sealing is made by a resin with high heat conductivity (not shown), thereby completing the bidirectional switch module.

Meanwhile, since the surface opposite to the semiconductor element mounting surface of the metal base plate is to be a contact surface in the attachment to a heat dissipation fin, an insulating film is thinly formed on this surface in some cases. Therefore, it is needless to mention that, when the bidirectional switch module is sealed by a resin, not only the semiconductor element mounting surface side but also the heat dissipation fin attachment surface side may be thinly covered with the resin. Of course, the thickness of the insulating film made of the resin is set to a specified thickness in consideration of the potential of the metal base plate and the heat conductivity.

As described above, in the present embodiment, without using any wiring layer having a wiring pattern formed thereon and any insulating substrate insulating the metal base plate and the wiring layer, the semiconductor elements constituting the bidirectional switch circuit and having junction electrodes (for example, K electrode, D electrode, C electrode) of the same potential connected to each of the nodes (nodes N1 and N2 in the present embodiment) are directly mounted on the respective metal base plates corresponding to each of the nodes, thereby constituting the bidirectional switch module. Accordingly, the cost reduction of the bidirectional switch module can be achieved. Further, the number of metal base plates can be optimized. Furthermore, since the insulating substrate is not used, the heat generated in semiconductor elements can be directly diffused to metal base plates, and accordingly, the heat dissipation characteristics are improved, and thus, the reliability of semiconductor elements can be improved. Moreover, in the present embodiment, different from other embodiments to be described later, the E electrodes of the first semiconductor switch and the second semiconductor switch can be connected in common, and accordingly, there is an advantage that a control circuit (not shown) for controlling the first semiconductor switch and the second semiconductor switch can be simplified.

Note that, in the bidirectional switch module according to the present embodiment, an attachment hole 137 to be used when attaching the bidirectional switch module to, for example, a heat dissipation fin (not shown) is provided. Although the number of the holes is one in this case, the present invention is not limited to this, and for example, four attachment holes may be provided at the four corners of the semiconductor module.

Second Embodiment

Next, the bidirectional switch shown in FIG. 1B will be described.

Figure 6:
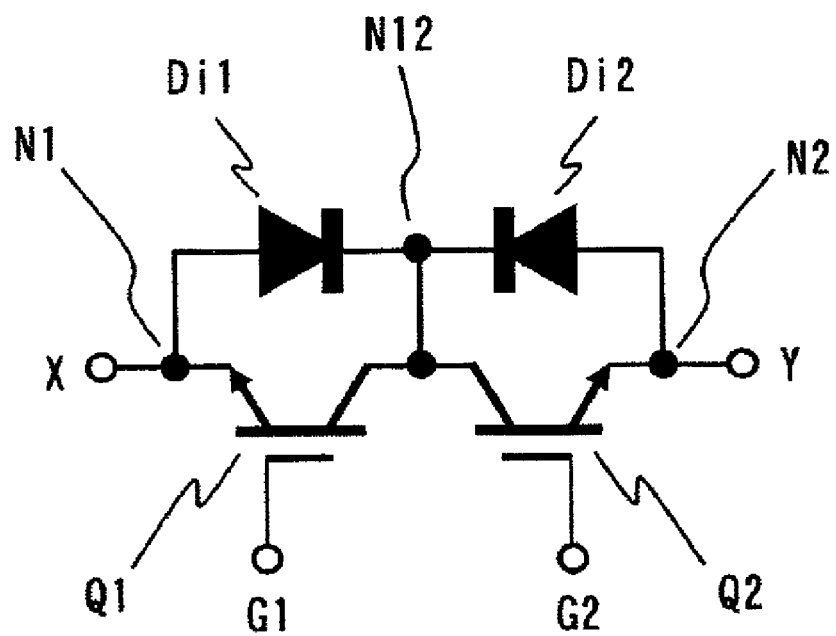
FIG. 6 is a circuit diagram of a bidirectional switch according to a second embodiment of the present invention.

FIG. 6 is a diagram showing the circuit of the bidirectional switch according to the second embodiment, in which FIG. 1B is shown again.

As shown in FIG. 6, in the bidirectional switch according to the present embodiment, between the X and Y terminals, the first semiconductor switch Q1 on the X terminal side and the second semiconductor switch Q2 are disposed in the inverse-series connection by their collector electrodes C, and the first diode Di1 and the second diode Di2 are disposed in the inverse-parallel connection with the semiconductor switches Q1 and Q2, respectively.

In order to control the semiconductor switches, the G electrode of the first semiconductor switch Q1 and the G electrode of the second semiconductor switch Q2 are extended to the outside and connected to a G1 terminal and a G2 terminal, respectively. Note that, in the present embodiment, since the E electrodes of the semiconductor switches Q1 and Q2 have the same potentials as those of the X terminal and the Y terminal, respectively, any independent terminal is not provided for the E electrodes.

As is apparent from FIG. 2 and FIG. 6, the bidirectional switch according to the present embodiment is a circuit in which the directions of the semiconductor elements in the bidirectional switch according to the first embodiment are inverted. Accordingly, the junction electrodes of the semiconductor elements constituting the bidirectional switch circuit are not connected to the node N1 and the node N2. On the other hand, the junction electrodes of the C electrodes of the first and second semiconductor switches and the K electrodes of the first and second diodes are connected to the node N12. More specifically, according to the present embodiment, the node N1 and the node N2 do not have the metal base plate, and the node N12 has the metal base plate. In other words, in the present embodiment, the number of the metal base plates is one.

Next, the principal part of the second embodiment according to the present invention will be described.

Figure 7:
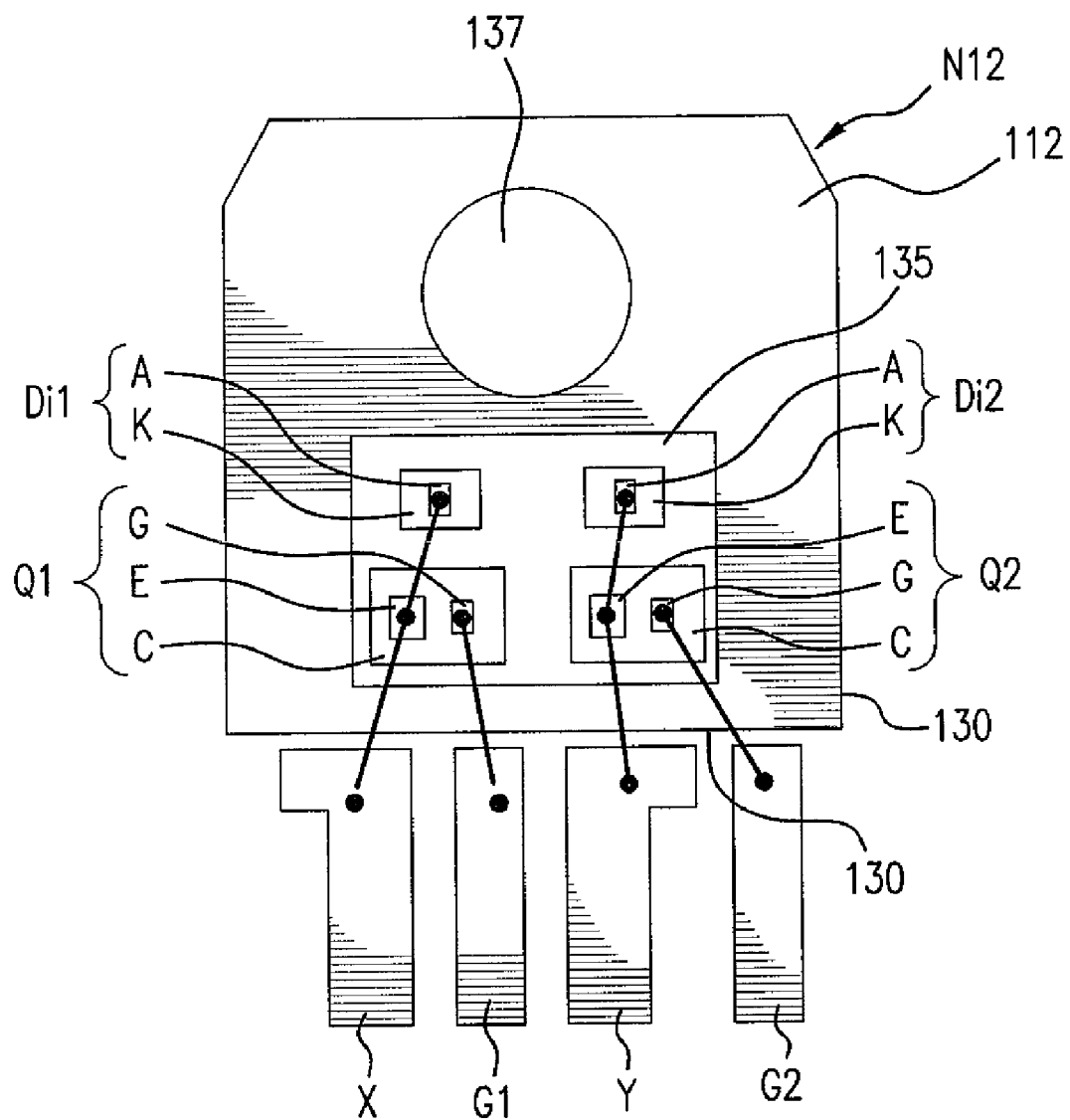
FIG. 7 is a configuration diagram showing a principal part of the bidirectional switch module according to the second embodiment of the present invention.

FIG. 7 is a configuration diagram showing a principal part of the bidirectional switch module according to the second embodiment. In FIG. 7, a bidirectional switch module in which semiconductor elements are mounted on one metal base plate is seen from the side of the semiconductor elements, with a sealing resin being omitted.

In the bidirectional switch module in FIG. 7, the metal base plate includes only a third metal base plate 112 that mounts semiconductor elements whose junction electrodes are arranged on the side of the node N12 and has a potential corresponding to the node N12. Note that, since no semiconductor element whose junction electrode is arranged on the side of the nodes is connected to the node N1 and the node N2, no metal base plate having corresponding potential is present.

Specifically, the first semiconductor switch Q1, the second semiconductor switch Q2, the first diode Di1, and the second diode Di2 are mounted on the third metal base plate 112.

As is apparent from FIG. 7, the bidirectional switch is provided with X and Y terminals to be current path terminals and G1 and G2 terminals for controlling the semiconductor switches Q1 and Q2. However, the nodes N1 and N2 corresponding to the X and Y terminals do not have a junction electrode. Accordingly, in the present embodiment, as shown in FIG. 7, lead terminals to be an X terminal, a Y terminal, a G1 terminal and a G2 terminal are independently provided separately from the metal base plate.

Next, the wiring in the bidirectional switch module will be described. Since the junction electrode of the semiconductor element is jointed and connected to the corresponding metal base plate, the wiring connection of the non-junction electrodes will be mainly described.

In FIG. 7, on the third metal base plate 112 corresponding to the node N12, the first semiconductor switch Q1, the second semiconductor switch Q2, the first diode Di1 and the second diode Di2 are mounted via junction electrodes, respectively. Also, the A electrode of the first diode Di1 is connected to the E electrode of the first semiconductor switch Q1 by a metal thin wire 130, and further, the E electrode of the first semiconductor switch Q1 is connected to the X terminal by a metal thin wire 130. Furthermore, the G electrode of the first semiconductor switch Q1 is connected to the G1 terminal by a metal thin wire 130.

Similarly, the A electrode of the second diode Di2 is connected to the E electrode of the second semiconductor switch Q2 by a metal thin wire 130, and further, the E electrode of the second semiconductor switch Q2 is connected to the Y terminal by a metal thin wire 130. Furthermore, the G electrode of the second semiconductor switch Q2 is connected to the G2 terminal by a metal thin wire 130.

By the connection mentioned above, the circuit of the bidirectional switch shown in FIG. 6 is configured. After a plurality of semiconductor elements are connected by wires, sealing is made by a resin with high heat conductivity (not shown), thereby completing the bidirectional switch module.

As described above, also in the present embodiment, without using any wiring layer having a wiring pattern formed thereon and any insulating substrate insulating the metal base plate and the wiring layer, the semiconductor elements having junction electrodes (for example, K electrode, D electrode, C electrode) of the same potential connected to the node N12 are directly mounted on the metal base plate corresponding to the node N12, thereby constituting the bidirectional switch module. Accordingly, the cost reduction of the bidirectional switch module can be achieved. Further, the number of metal base plates can be optimized. In particular, it is clear in comparison with other embodiments that the present embodiment is the only one where the number of metal base plates can be one, and accordingly there is an advantage that the structure can be simplified. Furthermore, since the insulating substrate is not used, the heat generated in semiconductor elements can be directly dissipated to the metal base plate, and consequently, the heat dissipation characteristics can be improved. Accordingly, the reliability of the semiconductor elements can be improved.

Third Embodiment

Next, the bidirectional switch shown in FIG. 1C will be described.

Figure 8:
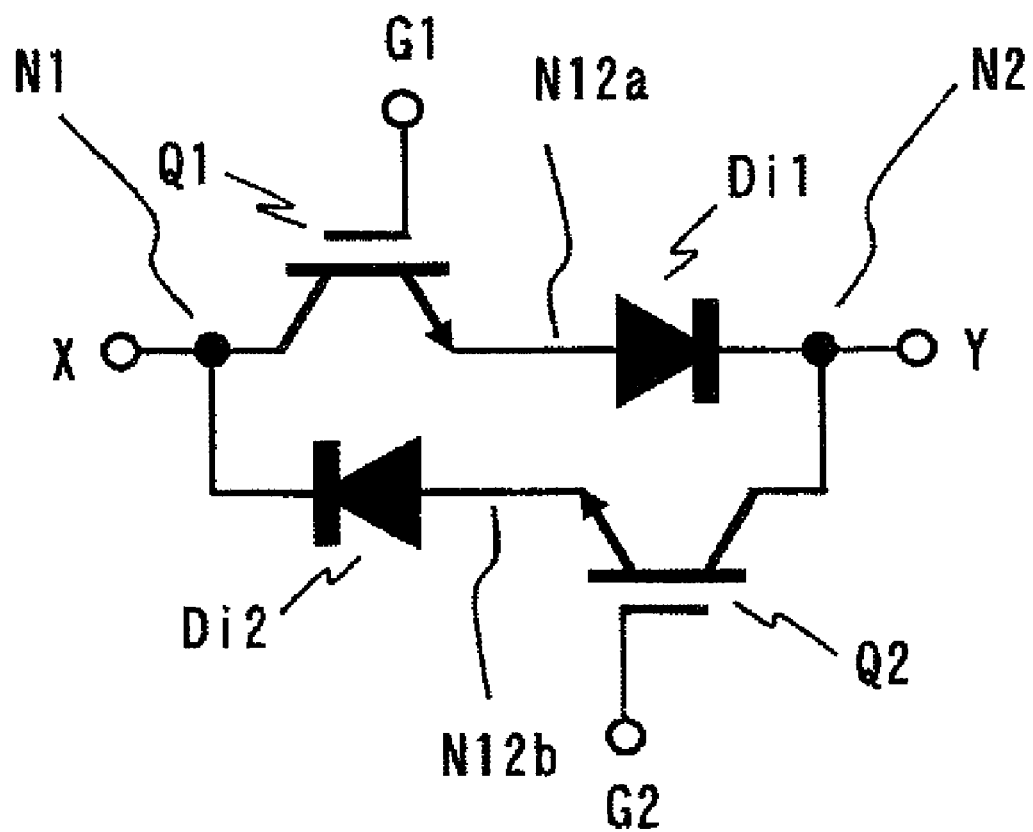
FIG. 8 is a circuit diagram of a bidirectional switch according to a third embodiment of the present invention.

FIG. 8 is a diagram showing the circuit of the bidirectional switch according to the second embodiment, in which FIG. 1C is shown again.

As shown in FIG. 8, in the bidirectional switch according to the present embodiment, between the X and Y terminals, the first semiconductor switch Q1 having the collector electrode C on the X terminal side is disposed in the normal-series connection with the first diode Di1 by the emitter electrode E thereof. Also, with the inverse polarity to this, the second semiconductor switch Q2 having the collector electrode C on the Y terminal side is disposed in the normal-series connection with the second diode Di2 by the emitter electrode E thereof. Further, the second semiconductor switch Q2 and the second diode Di2 are connected in parallel to the first semiconductor switch Q1 and the first diode Di1.

In order to control the semiconductor switches, the G electrode of the first semiconductor switch Q1 and the G electrode of the second semiconductor switch Q2 are extended to the outside and connected to a G1 terminal and a G2 terminal, respectively.

Here, the operation of the bidirectional switch according to the present embodiment will be briefly described. When a current is supplied from the X terminal to the Y terminal, a switch drive signal (not shown) is given to the G1 terminal and the first semiconductor switch Q1 is turned on. Then, the current flows from the X terminal to the first semiconductor switch Q1 and to the first diode Di1, and is outputted from the Y terminal. On the contrary, when a current is supplied from the Y terminal to the X terminal, a switch drive signal (not shown) is given to the G2 terminal and the second semiconductor switch Q2 is turned on. Then, the current flows from the Y terminal to the second semiconductor switch Q2 and to the second diode Di2, and is outputted from the X terminal. In this manner, the switch operation is carried out bidirectionally.

In order to apply the present embodiment, the circuit characteristics of the bidirectional switch in FIG. 8 will be examined. The bidirectional switch has four nodes, that is, the node N1 also functioning as the X terminal, the node N2 also functioning as the Y terminal, the node N12a serving as the connection point of the first semiconductor switch Q1 and the first diode, and the node N12b serving as the connection point of the second semiconductor switch Q2 and the second diode. Of these nodes, the nodes N12a and N12b do not have a junction electrode, but the node N1 is provided with the junction electrodes of the C electrode of the first semiconductor switch Q1 and the K electrode of the second diode Di2, and the node N2 is provided with the junction electrodes of the C electrode of the second semiconductor switch Q2 and the K electrode of the first diode Di1. More specifically, the bidirectional switch according to the present embodiment has a first metal base plate 101 corresponding to the node N1 and a second metal base plate 102 corresponding to the node N2.

Next, the principal part of the third embodiment according to the present invention will be described.

Figure 9:
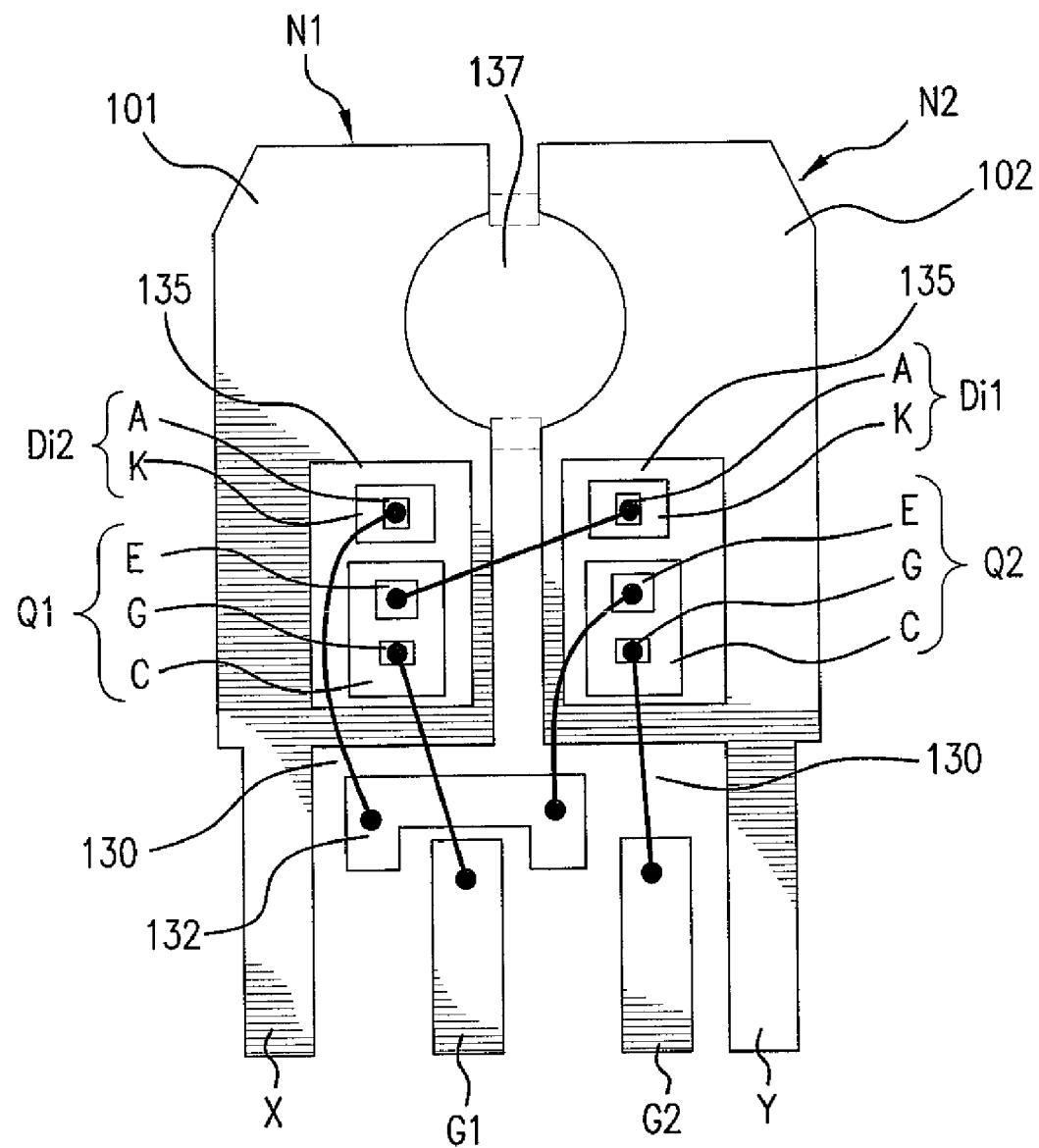
FIG. 9 is a configuration diagram showing a principal part of the bidirectional switch module according to the third embodiment of the present invention.

FIG. 9 is a configuration diagram showing a principal part of the bidirectional switch module according to the third embodiment. In FIG. 9, a bidirectional switch module in which semiconductor elements are mounted on two metal base plates is seen from the side of the semiconductor elements, with a sealing resin being omitted.

In the bidirectional switch module in FIG. 9, the metal base plates include the first metal base plate 101 that mounts semiconductor elements whose junction electrodes are arranged on the side of the node N1 and has the potential corresponding to the node N1, and the second metal base plate 102 that mounts semiconductor elements whose junction electrodes are arranged on the side of the node N2 and has the potential corresponding to the node N2. Note that, since no semiconductor element whose junction electrode is arranged on the side of the nodes is connected to the nodes N12a and N12b, no metal base plate having the corresponding potential is present.

Specifically, the first semiconductor switch Q1 and the second diode Di2 are mounted on the first metal base plate 101, and the second semiconductor switch Q2 and the first diode Di1 are mounted on the second metal base plate 102.

As is apparent from FIG. 9, the bidirectional switch is provided with X and Y terminals to be current path terminals and G1 and G2 terminals for controlling the semiconductor switches Q1 and Q2. Accordingly, as shown in FIG. 9, the first metal base plate 101 having the potential corresponding to the node N1 has the X terminal extended from the chip mounting base, and the second metal base plate 102 having the potential corresponding to the node N2 has the Y terminal extended from the chip mounting base. Since the G1 and G2 terminals are not connected to the junction electrode, lead terminals to be the G1 terminal and the G2 terminal are independently provided separately from the metal base plates.

Next, the wiring in the bidirectional switch module will be described. Since the junction electrode of the semiconductor element is jointed and connected to the corresponding metal base plate, the wiring connection of the non-junction electrodes will be mainly described.

In FIG. 9, on the first metal base plate 101 corresponding to the node N1, the first semiconductor switch Q1 and the second diode Di2 are mounted via junction electrodes, respectively. Also, on the second metal base plate 102 corresponding to the node N2, the second semiconductor switch Q2 and the first diode Di1 are mounted via junction electrodes, respectively. Further, the A electrode of the second diode Di2 is connected to the E electrode of the second semiconductor switch Q2 via the wiring plate 132 by a metal thin wire 130, and the E electrode of the first semiconductor switch Q1 is connected to the A electrode of the first diode Di1 by a metal thin wire 130. Furthermore, the G electrodes of the first semiconductor switch Q1 and the second semiconductor switch Q2 are connected to the G1 and G2 terminals by metal thin wires 130, respectively.

By the connection mentioned above, the circuit of the bidirectional switch shown in FIG. 8 is configured. After a plurality of semiconductor elements are connected by wires, sealing is made by a resin with high heat conductivity (not shown), thereby completing the bidirectional switch module.

As described above, also in the present embodiment, without using any wiring layer having a wiring pattern formed thereon and any insulating substrate insulating the metal base plate and the wiring layer, the semiconductor elements having junction electrodes (for example, K electrode, D electrode, C electrode) of the same potential connected to the node N1 are directly mounted on the first metal base plate corresponding to the node N1, and the semiconductor elements having junction electrodes (for example, K electrode, D electrode, C electrode) of the same potential connected to the node N2 are directly mounted on the second metal base plate corresponding to the node N2, thereby constituting the bidirectional switch module. Accordingly, the cost reduction of the bidirectional switch module can be achieved. Further, the number of metal base plates can be optimized. Furthermore, since the insulating substrate is not used, the heat generated in the semiconductor elements can be directly dissipated to the metal base plates, and consequently, the heat dissipation characteristics can be improved. Accordingly, the reliability of the semiconductor elements can be improved.

Fourth Embodiment

In the bidirectional switch according to the third embodiment, the nodes N1 and N2 have junction electrodes, and the nodes N12a and N12b do not have the junction electrode. However, the circuit may be modified so that the nodes N12a and N12b have the junction electrodes. This modified circuit is shown in FIG. 10A.

Figure 10A:
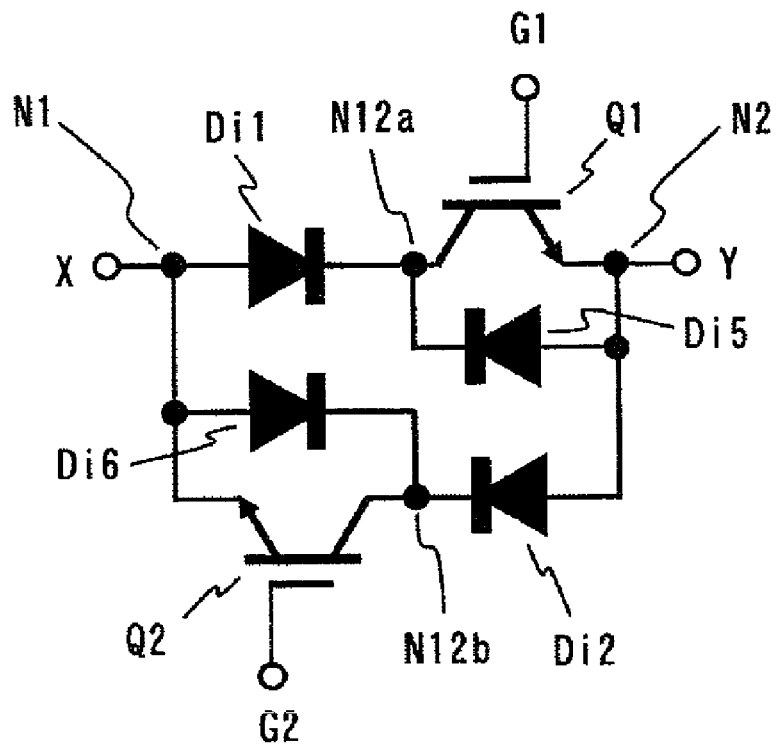
FIG. 10A is a circuit diagram of a bidirectional switch according to a fourth embodiment of the present invention.
Figure 10B:
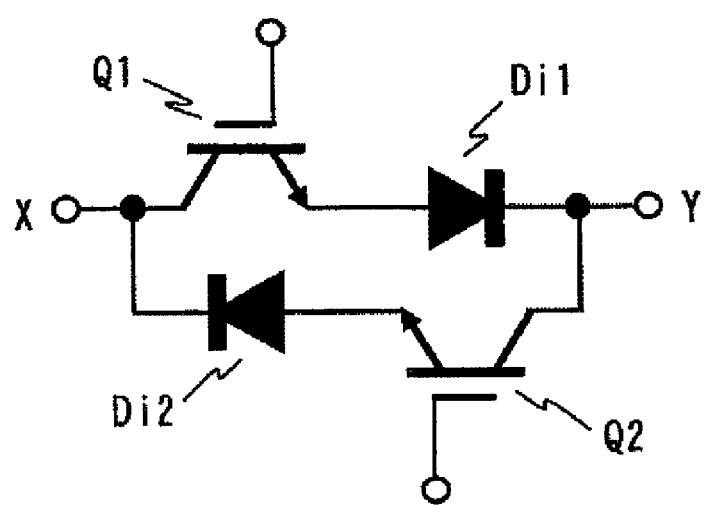
FIG. 10B is a circuit diagram of the bidirectional switch according to the third embodiment for comparison.

FIG. 10A shows the circuit of a bidirectional switch according to the fourth embodiment, and FIG. 10B shows the circuit of the bidirectional switch according to the third embodiment for comparison.

As shown in FIG. 10A, in the bidirectional switch according to the present embodiment, between the X and Y terminals, the first diode Di1 having an A electrode on the X terminal side is disposed in the normal-series connection with the first semiconductor switch Q1 by the K electrode side thereof, and a fifth diode Di5 is disposed in the inverse-parallel connection with the first semiconductor switch Q1. Also, with the inverse polarity to this, the second diode Di2 having an A electrode on the Y terminal side is disposed in the normal-series connection with the second semiconductor switch Q2 by the K electrode side thereof, and a sixth diode Di6 is disposed in the inverse-parallel connection with the second semiconductor switch Q2. Further, the second diode Di2, the second semiconductor switch Q2 and the sixth diode Di6 are connected in parallel to the first diode Di1, the first semiconductor switch Q1 and the fifth diode Di5.

In order to control the semiconductor switches, the G electrode of the first semiconductor switch Q1 and the G electrode of the second semiconductor switch Q2 are extended to the outside, and connected to a G1 terminal and a G2 terminal, respectively. Note that, in the present embodiment, since the X terminal and the Y terminal also functioning as the nodes N1 and N2 do not have a junction electrode, different from the third embodiment, independent terminals are provided for the X terminal and the Y terminal.

Herein, the operation of the bidirectional switch according to the present embodiment will be briefly described. When a current is supplied from the X terminal to the Y terminal, a switch drive signal (not shown) is given to the G1 terminal and the first semiconductor switch Q1 is turned on. Then, the current flows from the X terminal to the first diode Di1 and to the first semiconductor switch Q1, and is outputted from the Y terminal. On the contrary, when a current is supplied from the Y terminal to the X terminal, a switch drive signal (not shown) is given to the G2 terminal and the second semiconductor switch Q2 is turned on. Then, the current flows from the Y terminal to the second diode Di2 and to the second semiconductor switch Q2, and is outputted from the X terminal. In this manner, the switch operation is carried out bidirectionally. Note that, different from the third embodiment, diodes are not inserted in series to the E electrodes of the first semiconductor switch Q1 and the second semiconductor switch Q2 in the present embodiment, and accordingly, for the purpose of protection of the respective semiconductor switches, the fifth diode Di5 and the sixth diode Di6 are disposed in the inverse-parallel connection.

In order to apply the present embodiment, the circuit characteristics of the bidirectional switch in FIG. 10A will be examined. The bidirectional switch has four nodes, that is, the node N1 also functioning as the X terminal, the node N2 also functioning as the Y terminal, the node N12a serving as the connection point of the first diode Di1, the first semiconductor switch Q1 and the fifth diode Di5, and the node N12b serving as the connection point of the second semiconductor switch Q2, the second diode Di2 and the sixth diode Di6. Of these nodes, the nodes N1 and N2 do not have a junction electrode, but the node N12a is provided with the junction electrodes of the C electrode of the first semiconductor switch Q1 and the K electrodes of the fifth diode Di5 and the first diode Di1, and the node N12b is provided with the junction electrodes of the C electrode of the second semiconductor switch Q2 and the K electrodes of the sixth diode Di6 and the second diode Di2. More specifically, the bidirectional switch according to the present embodiment has a third-a metal base plate 112a corresponding to the node N12a and a third-b metal base plate 112b corresponding to the node N12b.

Next, the principal part of the fourth embodiment according to the present invention will be described.

Figure 11:
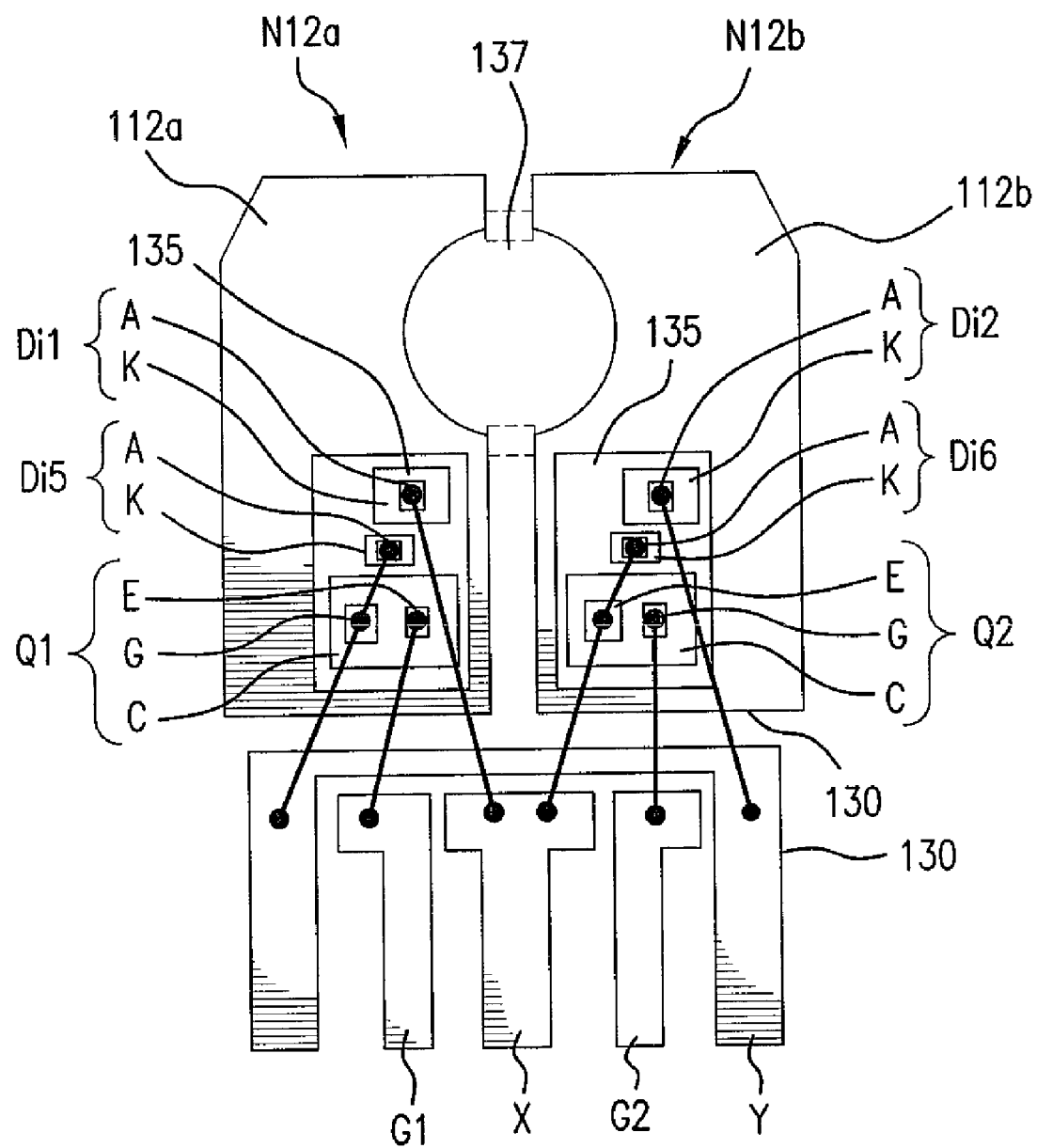
FIG. 11 is a configuration diagram showing a principal part of the bidirectional switch module according to the fourth embodiment of the present invention.

FIG. 11 is a configuration diagram showing a principal part of the bidirectional switch module according to the fourth embodiment. In FIG. 11, a bidirectional switch module in which semiconductor elements are mounted on two metal base plates is seen from the side of the semiconductor elements, with a sealing resin being omitted.

In the bidirectional switch module in FIG. 11, the metal base plates include the third-a metal base plate 112a that mounts semiconductor elements whose junction electrodes are arranged on the side of the node N12a and has the potential corresponding to the node N12a, and the third-b metal base plate 112b that mounts semiconductor elements whose junction electrodes are arranged on the side of the node N12b and has the potential corresponding to the node N12b. Note that, since no semiconductor element whose junction electrode is arranged on the side of the nodes is connected to the nodes N1 and N2, no metal base plate having the corresponding potential is present.

Specifically, the first semiconductor switch Q1, the fifth diode Di5 and the first diode Di1 are mounted on the third-a metal base plate 112a, and the second semiconductor switch Q2, the sixth diode Dib and the second diode Di2 are mounted on the third-b metal base plate 112b.

As is apparent from FIG. 11, the bidirectional switch is provided with X and Y terminals to be current path terminals and G1 and G2 terminals for controlling the semiconductor switches Q1 and Q2. However, in the present embodiment, since both the nodes N1 and N2 do not have a junction electrode, similar to the G1 terminal and the G2 terminal, lead terminals are independently provided for the X terminal and the Y terminal, respectively.

Next, the wiring in the bidirectional switch module will be described. Since the junction electrode of the semiconductor element is jointed and connected to the corresponding metal base plate, the wiring connection of the non-junction electrodes will be mainly described.

In FIG. 11, on the third-a metal base plate 112a corresponding to the node N12a, the first semiconductor switch Q1, the fifth diode Di5 and the first diode Di1 are mounted via junction electrodes, respectively. Also, the A electrode of the first diode Di1 is connected to the X terminal by a metal thin wire 130. Further, the G electrode of the first semiconductor switch Q1 is connected to the G1 terminal by a metal thin wire 130, and the E electrode thereof is connected to the A electrode of the fifth diode Di5 by a metal thin wire 130 and also connected to the Y terminal also functioning as a wiring plate by a metal thin wire 130. Similarly, on the third-b metal base plate 112b corresponding to the node N12b, the second semiconductor switch Q2, the sixth diode Di6 and the second diode Di2 are mounted via junction electrodes, respectively. Also, the A electrode of the second diode Di2 is connected to the Y terminal also functioning as a wiring plate by a metal thin wire 130. Further, the G electrode of the second semiconductor switch Q2 is connected to the G2 terminal by a metal thin wire 130, and the E electrode thereof is connected to the A electrode of the sixth diode Di6 by a metal thin wire 130 and also connected to the X terminal by a metal thin wire 130.

By the connection mentioned above, the circuit of the bidirectional switch shown in FIG. 10A is configured. After a plurality of semiconductor elements are connected by wires, sealing is made by a resin with high heat conductivity (not shown), thereby completing the bidirectional switch module.

As described above, also in the present embodiment, without using any wiring layer having a wiring pattern formed thereon and any insulating substrate insulating the metal base plate and the wiring layer, the semiconductor elements having junction electrodes (for example, K electrode, D electrode, C electrode) of the same potential connected to the node N12a are directly mounted on the third-a metal base plate corresponding to the node N12a, and the semiconductor elements having junction electrodes (for example, K electrode, D electrode, C electrode) of the same potential connected to the node N12b are directly mounted on the third-b metal base plate corresponding to the node N12b, thereby constituting the bidirectional switch module. Accordingly, the cost reduction of the bidirectional switch module can be achieved. Further, the number of metal base plates can be optimized. Furthermore, since the insulating substrate is not used, the heat generated in the semiconductor elements can be directly dissipated to the metal base plates, and consequently, the heat dissipation characteristics can be improved. Accordingly, the reliability of the semiconductor elements can be improved.

Fifth Embodiment

Next, the bidirectional switch shown in FIG. 1D will be described.

Figure 12:
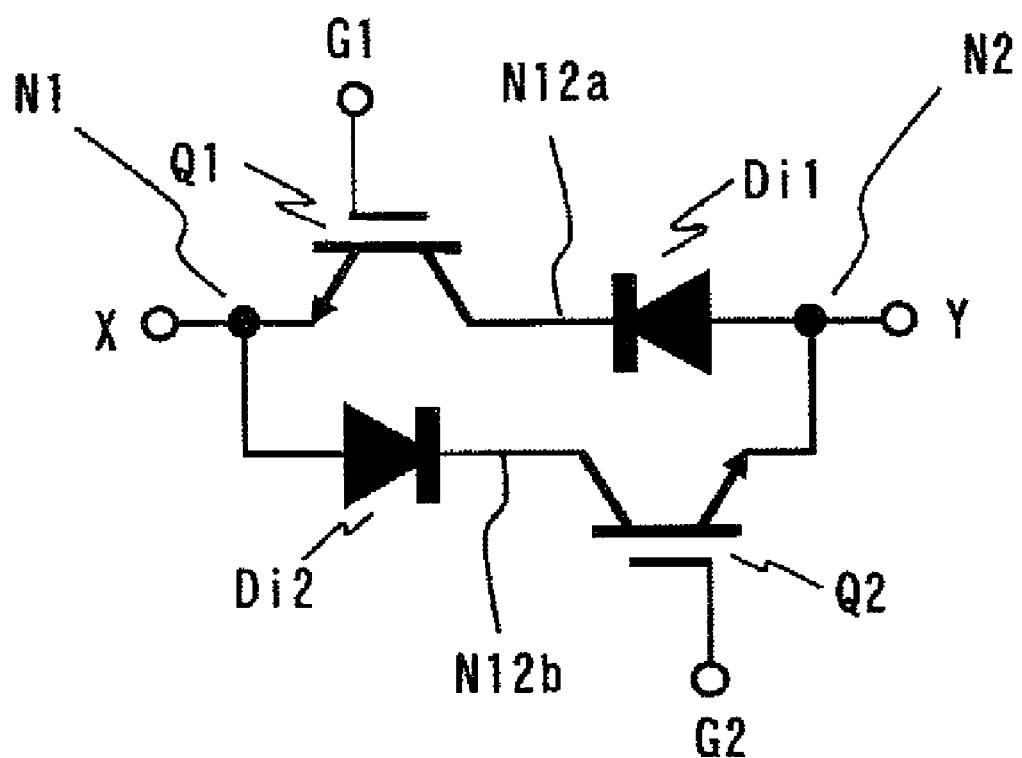
FIG. 12 is a circuit diagram of a bidirectional switch according to a fifth embodiment of the present invention.

FIG. 12 is a diagram showing the circuit of the bidirectional switch according to the fifth embodiment, in which FIG. 1D is shown again.

As shown in FIG. 12, the bidirectional switch according to the present embodiment is a circuit having the configuration in which the directions of the semiconductor elements in the bidirectional switch circuit according to the third embodiment are inverted. That is, between the X and Y terminals, the first semiconductor switch Q1 having the E electrode on the X terminal side is disposed in the normal-series connection with the first diode Di1 by the C electrode thereof. Also, with the inverse polarity to this, the second semiconductor switch Q2 having the E electrode on the Y terminal side is disposed in the normal-series connection with the second diode Di2 by the C electrode thereof. Further, the second semiconductor switch Q2 and the second diode Di2 are connected in parallel to the first semiconductor switch Q1 and the first diode Di1.

In order to control the semiconductor switches, the G electrode of the first semiconductor switch Q1 and the G electrode of the second semiconductor switch Q2 are extended to the outside, and connected to a G1 terminal and a G2 terminal, respectively. Note that, in the present embodiment, since the X terminal and the Y terminal also functioning as the nodes N1 and N2 do not have a junction electrode, independent terminals are provided for the X terminal and the Y terminal.

Herein, the operation of the bidirectional switch according to the present embodiment will be briefly described. When a current is supplied from the X terminal to the Y terminal, a switch drive signal (not shown) is given to the G2 terminal and the second semiconductor switch Q2 is turned on. Then, the current flows from the X terminal to the second diode Di2 and to the second semiconductor switch Q2, and is outputted from the Y terminal. On the contrary, when a current is supplied from the Y terminal to the X terminal, a switch drive signal (not shown) is given to the G1 terminal and the first semiconductor switch Q1 is turned on. Then, the current flows from the Y terminal to the first diode Di1 and to the first semiconductor switch Q1, and is outputted from the X terminal. In this manner, the switch operation is carried out bidirectionally.

In order to apply the present embodiment, the circuit characteristics of the bidirectional switch in FIG. 12 will be examined. The bidirectional switch has four nodes, that is, the node N1 also functioning as the X terminal, the node N2 also functioning as the Y terminal, the node N12a serving as the connection point of the first semiconductor switch Q1 and the first diode Di1, and the node N12b serving as the connection point of the second diode Dig and the second semiconductor switch Q2. Of these nodes, the nodes N1 and N2 do not have a junction electrode, but the node N12a is provided with the junction electrodes of the C electrode of the first semiconductor switch Q1 and the K electrode of the first diode Di1, and the node N12b is provided with the junction electrodes of the C electrode of the second semiconductor switch Q2 and the K electrode of the second diode Di2. More specifically, the bidirectional switch according to the present embodiment has a third-a metal base plate 112a corresponding to the node N12a and a third-b metal base plate 112b corresponding to the node N12b.

Next, the principal part of the fifth embodiment according to the present invention will be described.

Figure 13:
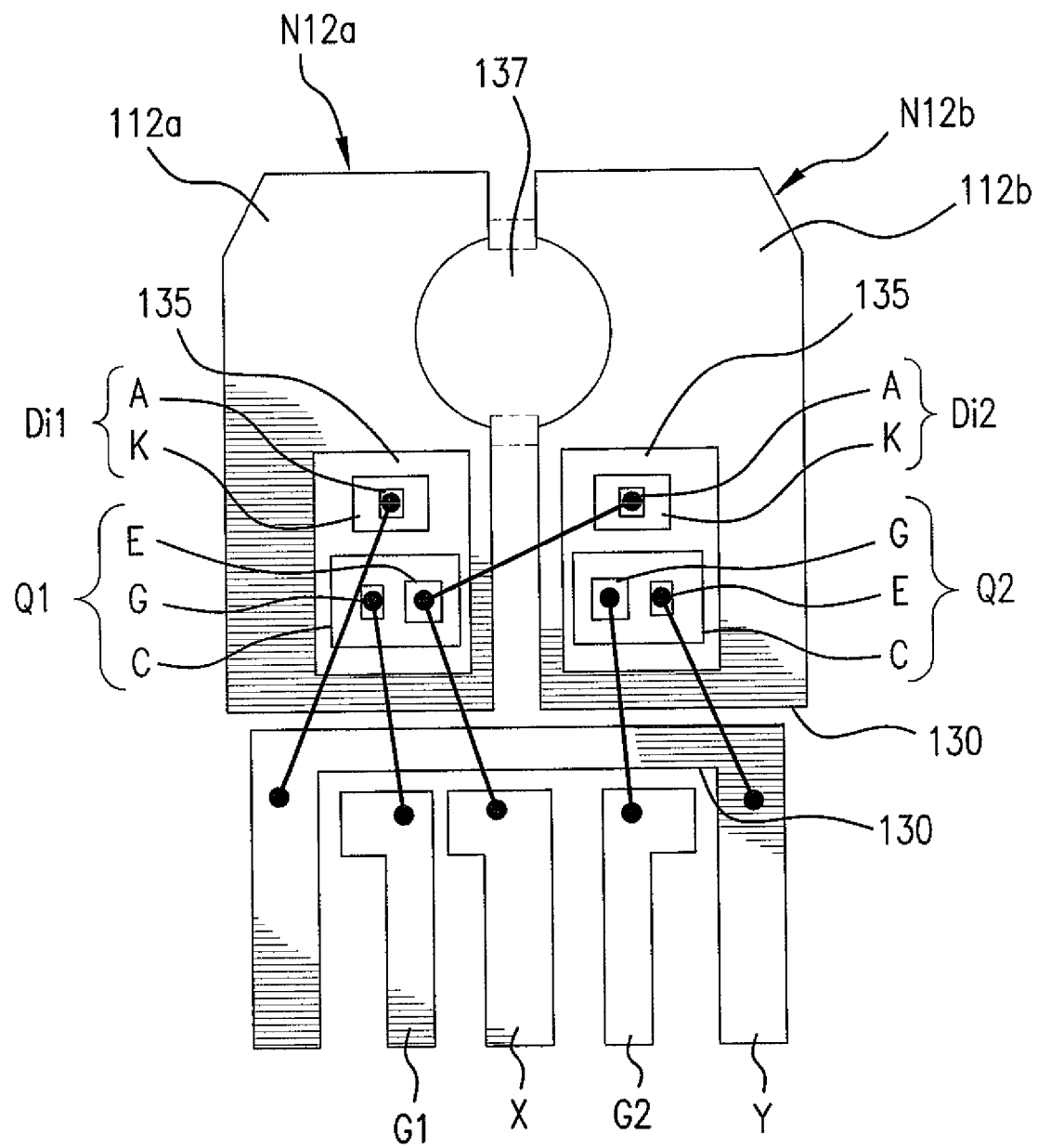
FIG. 13 is a configuration diagram showing a principal part of the bidirectional switch module according to the fifth embodiment of the present invention.

FIG. 13 is a configuration diagram showing a principal part of the bidirectional switch module according to the fifth embodiment. In FIG. 13, a bidirectional switch module in which semiconductor elements are mounted on two metal base plates is seen from the side of the semiconductor elements, with a sealing resin being omitted.

In the bidirectional switch module in FIG. 13, the metal base plates include the third-a metal base plate 112a that mounts semiconductor elements whose junction electrodes are arranged on the side of the node N12a and has the potential corresponding to the node N12a, and the third-b metal base plate 112b that mounts semiconductor elements whose junction electrodes are arranged on the side of the node N12b and has the potential corresponding to the node N12b. Note that, since no semiconductor element whose junction electrode is arranged on the side of the nodes is connected to the nodes N1 and N2, no metal base plate having the corresponding potential is present.

Specifically, the first semiconductor switch Q1 and the first diode Di1 are mounted on the third-a metal base plate 112a, and the second semiconductor switch Q2 and the second diode Di2 are mounted on the third-b metal base plate 112b.

As is apparent from FIG. 13, the bidirectional switch is provided with X and Y terminals to be current path terminals and G1 and G2 terminals for controlling the semiconductor switches Q1 and Q2. However, in the present embodiment, since both the nodes N1 and N2 do not have a junction electrode, similar to the G1 terminal and the G2 terminal, lead terminals are independently provided for the X terminal and the Y terminal, respectively.

Next, the wiring in the bidirectional switch module will be described. Since the junction electrode of the semiconductor element is jointed and connected to the corresponding metal base plate, the wiring connection of the non-junction electrodes will be mainly described.

In FIG. 13, on the third-a metal base plate 112a corresponding to the node N12a, the first semiconductor switch Q1 and the first diode Di1 are mounted via junction electrodes, respectively. Also, on the third-b metal base plate 112b corresponding to the node N12b, the second semiconductor switch Q2 and the second diode Di2 are mounted via junction electrodes, respectively. Further, the A electrode of the first diode Di1 is connected to the Y terminal also functioning as a wiring plate by a metal thin wire 130. Also, the G electrode of the first semiconductor switch Q1 is connected to the G1 terminal by a metal thin wire 130, and the E electrode thereof is connected to the A electrode of the second diode Di2 by a metal thin wire 130 and also connected to the X terminal by a metal thin wire 130. Similarly, the G electrode of the second semiconductor switch Q2 is connected to the G2 terminal by a metal thin wire 130, and the E electrode thereof is connected to the Y terminal also functioning as a wiring plate by a metal thin wire 130.

By the connection mentioned above, the circuit of the bidirectional switch shown in FIG. 12 is configured. After a plurality of semiconductor elements are connected by wires, sealing is made by a resin with high heat conductivity (not shown), thereby completing the bidirectional switch module.

As described above, also in the present embodiment, without using any wiring layer having a wiring pattern formed thereon and any insulating substrate insulating the metal base plate and the wiring layer, the semiconductor elements having junction electrodes (for example, K electrode, D electrode, C electrode) of the same potential connected to the node N12a are directly mounted on the third-a metal base plate corresponding to the node N12a, and the semiconductor elements having junction electrodes (for example, K electrode, D electrode, C electrode) of the same potential connected to the node N12b are directly mounted on the third-b metal base plate corresponding to the node N12b, thereby constituting the bidirectional switch module. Accordingly, the cost reduction of the bidirectional switch module can be achieved. Further, the number of metal base plates can be optimized. Furthermore, since the insulating substrate is not used, the heat generated in the semiconductor elements can be directly dissipated to the metal base plates, and consequently, the heat dissipation characteristics can be improved. Accordingly, the reliability of the semiconductor elements can be improved.

What is claimed is:

1. A bidirectional switch module including a bidirectional switch circuit in which a plurality of semiconductor elements are combined and in which a current can flow bidirectionally from a first terminal to a second terminal and from the second terminal to the first terminal, the bidirectional switch module comprising:

a first metal base plate serving as a heat dissipation plate and connected to the first terminal;

a second metal base plate serving as a heat dissipation plate and connected to the second terminal;

a first semiconductor switch element provided on a first semiconductor chip having a pair of surfaces, including a first electrode provided on one surface of the first semiconductor chip and connected to the first terminal, a second electrode provided on other surface of the first semiconductor chip and serving as a current path to the first electrode, and a third electrode provided on the other surface of the first semiconductor chip and controlling a current between the first electrode and the second electrode, and mounted on the first metal base plate so that the first electrode and the first metal base plate face each other;

a first diode element provided on a second semiconductor chip having a pair of surfaces, including a first cathode electrode provided on one surface of the second semiconductor chip and connected to the first terminal, and a first anode electrode provided on other surface of the second semiconductor chip, and mounted on the first metal base plate so that the first cathode electrode and the first metal base plate face each other;

a second semiconductor switch element provided on a third semiconductor chip having a pair of surfaces, including a fourth electrode provided on one surface of the third semiconductor chip and connected to the second terminal, a fifth electrode provided on other surface of the third semiconductor chip and serving as a current path to the fourth electrode, and a sixth electrode provided on the other surface of the third semiconductor chip and controlling a current between the fourth electrode and the fifth electrode, and mounted on the second metal base plate so that the fourth electrode and the second metal base plate face each other;

a second diode element provided on a fourth semiconductor chip having a pair of surfaces, including a second cathode electrode provided on one surface of the fourth semiconductor chip and connected to the second terminal, and a second anode electrode provided on other surface of the fourth semiconductor chip, and mounted on the second metal base plate so that the second cathode electrode and the second metal base plate face each other;

a first control terminal connected to the third electrode;

a second control terminal connected to the sixth electrode; and wires electrically connecting the first anode electrode, the second anode electrode, the second electrode, and the fifth electrode, respectively.

2. A bidirectional switch module including a bidirectional switch circuit in which a plurality of semiconductor elements are combined and in which a current can flow bidirectionally from a first terminal to a second terminal and from the second terminal to the first terminal, the bidirectional switch module comprising:

a first metal base plate including a first semiconductor chip and a second semiconductor chip mounted thereon, having an area wider than a total area of the first semiconductor chip and the second semiconductor chip, and connected to the first terminal;

a second metal base plate including a third semiconductor chip and a fourth semiconductor chip mounted thereon, having an area wider than a total area of the third semiconductor chip and the fourth semiconductor chip, and connected to the second terminal;

a first semiconductor switch element provided on the first semiconductor chip, including a first electrode provided on one surface of the first semiconductor chip, a second electrode provided on other surface of the first semiconductor chip and serving as a current path to the first electrode, and a third electrode provided on the other surface of the first semiconductor chip and controlling a current between the first electrode and the second electrode, and provided so that a surface of the first electrode and a surface of the first metal base plate are connected to each other;

a first diode element provided on the second semiconductor chip, including a first cathode electrode provided on one surface of the second semiconductor chip, and a first anode electrode provided on other surface of the second semiconductor chip, and provided so that a surface of the first cathode electrode and the surface of the first metal base plate are connected to each other;

a second semiconductor switch element provided on the third semiconductor chip, including a fourth electrode provided on one surface of the third semiconductor chip, a fifth electrode provided on other surface of the third semiconductor chip and serving as a current path to the fourth electrode, and a sixth electrode provided on the other surface of the third semiconductor chip and controlling a current between the fourth electrode and the fifth electrode, and provided so that a surface of the fourth electrode and a surface of the second metal base plate are connected to each other;

a second diode element provided on the fourth semiconductor chip, including a second cathode electrode provided on one surface of the fourth semiconductor chip, and a second anode electrode provided on other surface of the fourth semiconductor chip, and provided so that a surface of the second cathode electrode and the surface of the second metal base plate are connected to each other;

a first control terminal connected to the third electrode; and a second control terminal connected to the sixth electrode;

wherein, when a current flows from the first terminal to the second terminal, the current flows through the first metal base plate, the first semiconductor switch element, the second diode element, and the second metal base plate by supplying a first drive signal to the first control terminal, and when a current flows from the second terminal to the first terminal, the current flows through the second metal base plate, the second semiconductor switch element, the first diode element, and the first metal base plate by supplying a second drive signal to the second control terminal.

3. The bidirectional switch module according to claim 2, including wires electrically connecting the first anode electrode, the second anode electrode, the second electrode, and the fifth electrode respectively.

4. The bidirectional switch module according to claim 1, wherein the wires electrically connecting the first anode electrode, the second anode electrode, the second electrode, and the fifth electrode respectively are comprised of metal thin wires.

5. The bidirectional switch module according to claim 3, wherein the wires electrically connecting the first anode electrode, the second anode electrode, the second electrode, and the fifth electrode respectively are comprised of metal thin wires.

6. The bidirectional switch module according to claim 1, wherein the first metal base plate and the first terminal are one metal plate constructed integrally, and the second metal base plate and the second terminal are another metal plate constructed integrally.

7. The bidirectional switch module according to claim 2, wherein the first metal base plate and the first terminal are one metal plate constructed integrally, and the second metal base plate and the second terminal are another metal plate constructed integrally.

8. The bidirectional switch module according to claim 3, wherein the first metal base plate and the first terminal are one metal plate constructed integrally, and the second metal base plate and the second terminal are another metal plate constructed integrally.

9. The bidirectional switch module according to claim 4, wherein the first metal base plate and the first terminal are one metal plate constructed integrally, and the second metal base plate and the second terminal are another metal plate constructed integrally.

10. The bidirectional switch module according to claim 1, wherein the first metal base plate and the first terminal are metal plates continuously connected, and the second metal base plate and the second terminal are other metal plates continuously connected.

11. The bidirectional switch module according to claim 2, wherein the first metal base plate and the first terminal are metal plates continuously connected, and the second metal base plate and the second terminal are other metal plates continuously connected.

12. The bidirectional switch module according to claim 3, wherein the first metal base plate and the first terminal are metal plates continuously connected, and the second metal base plate and the second terminal are other metal plates continuously connected.

13. The bidirectional switch module according to claim 4, wherein the first metal base plate and the first terminal are metal plates continuously connected, and the second metal base plate and the second terminal are other metal plates continuously connected.

14. The bidirectional switch module according to claim 1, wherein the first semiconductor switch element and the second semiconductor switch element are comprised of MOSFETs.

15. The bidirectional switch module according to claim 2, wherein the first semiconductor switch element and the second semiconductor switch element are comprised of MOSFETs.

16. The bidirectional switch module according to claim 3, wherein the first semiconductor switch element and the second semiconductor switch element are comprised of MOSFETs.

17. The bidirectional switch module according to claim 4, wherein the first semiconductor switch element and the second semiconductor switch element are comprised of MOSFETs.

18. The bidirectional switch module according to claim 5, wherein the first semiconductor switch element and the second semiconductor switch element are comprised of MOSFETs.

19. The bidirectional switch module according to claim 6, wherein the first semiconductor switch element and the second semiconductor switch element are comprised of MOSFETs.

20. The bidirectional switch module according to claim 1, wherein the first semiconductor switch element and the second semiconductor switch element are comprised of IGBTs.

21. The bidirectional switch module according to claim 2, wherein the first semiconductor switch element and the second semiconductor switch element are comprised of IGBTs.

22. The bidirectional switch module according to claim 3, wherein the first semiconductor switch element and the second semiconductor switch element are comprised of IGBTs.

23. The bidirectional switch module according to claim 4, wherein the first semiconductor switch element and the second semiconductor switch element are comprised of IGBTs.

24. The bidirectional switch module according to claim 5, wherein the first semiconductor switch element and the second semiconductor switch element are comprised of IGBTs.

25. The bidirectional switch module according to claim 6, wherein the first semiconductor switch element and the second semiconductor switch element are comprised of IGBTs.

26. The bidirectional switch module according to claim 1, wherein the first semiconductor switch element and the second semiconductor switch element are composed of bipolar transistors.

27. The bidirectional switch module according to claim 2, wherein the first semiconductor switch element and the second semiconductor switch element are composed of bipolar transistors.

28. The bidirectional switch module according to claim 3, wherein the first semiconductor switch element and the second semiconductor switch element are composed of bipolar transistors.

29. The bidirectional switch module according to claim 4, wherein the first semiconductor switch element and the second semiconductor switch element are composed of bipolar transistors.

30. The bidirectional switch module according to claim 5, wherein the first semiconductor switch element and the second semiconductor switch element are composed of bipolar transistors.

31. The bidirectional switch module according to claim 6, wherein the first semiconductor switch element and the second semiconductor switch element are composed of bipolar transistors.

32. The bidirectional switch module according to claim 1, wherein the first semiconductor switch element and the second semiconductor switch element are comprised of MOSFETs, the first electrode and the fourth electrode are drain electrodes, the second electrode and the fifth electrode are source electrodes, and the third electrode and the sixth electrode are gate electrodes.

33. The bidirectional switch module according to claim 2, wherein the first semiconductor switch element and the second semiconductor switch element are comprised of MOSFETs, the first electrode and the fourth electrode are drain electrodes, the second electrode and the fifth electrode are source electrodes, and the third electrode and the sixth electrode are gate electrodes.

34. The bidirectional switch module according to claim 3, wherein the first semiconductor switch element and the second semiconductor switch element are comprised of MOSFETs, the first electrode and the fourth electrode are drain electrodes, the second electrode and the fifth electrode are source electrodes, and the third electrode and the sixth electrode are gate electrodes.

35. The bidirectional switch module according to claim 4, wherein the first semiconductor switch element and the second semiconductor switch element are comprised of MOSFETs, the first electrode and the fourth electrode are drain electrodes, the second electrode and the fifth electrode are source electrodes, and the third electrode and the sixth electrode are gate electrodes.

36. The bidirectional switch module according to claim 5, wherein the first semiconductor switch element and the second semiconductor switch element are comprised of MOSFETs, the first electrode and the fourth electrode are drain electrodes, the second electrode and the fifth electrode are source electrodes, and the third electrode and the sixth electrode are gate electrodes.

37. The bidirectional switch module according to claim 6, wherein the first semiconductor switch element and the second semiconductor switch element are comprised of MOSFETs, the first electrode and the fourth electrode are drain electrodes, the second electrode and the fifth electrode are source electrodes, and the third electrode and the sixth electrode are gate electrodes.

38. The bidirectional switch module according to claim 1, wherein the first semiconductor switch element and the second semiconductor switch element are comprised of IGBTs, the first electrode and the fourth electrode are collector electrodes, the second electrode and the fifth electrode are emitter electrodes, and the third electrode and the sixth electrode are gate electrodes.

39. The bidirectional switch module according to claim 2, wherein the first semiconductor switch element and the second semiconductor switch element are comprised of IGBTs, the first electrode and the fourth electrode are collector electrodes, the second electrode and the fifth electrode are emitter electrodes, and the third electrode and the sixth electrode are gate electrodes.

40. The bidirectional switch module according to claim 3, wherein the first semiconductor switch element and the second semiconductor switch element are comprised of IGBTs, the first electrode and the fourth electrode are collector electrodes, the second electrode and the fifth electrode are emitter electrodes, and the third electrode and the sixth electrode are gate electrodes.

41. The bidirectional switch module according to claim 4, wherein the first semiconductor switch element and the second semiconductor switch element are comprised of IGBTs, the first electrode and the fourth electrode are collector electrodes, the second electrode and the fifth electrode are emitter electrodes, and the third electrode and the sixth electrode are gate electrodes.

42. The bidirectional switch module according to claim 5, wherein the first semiconductor switch element and the second semiconductor switch element are comprised of IGBTs, the first electrode and the fourth electrode are collector electrodes, the second electrode and the fifth electrode are emitter electrodes, and the third electrode and the sixth electrode are gate electrodes.

43. The bidirectional switch module according to claim 6, wherein the first semiconductor switch element and the second semiconductor switch element are comprised of IGBTs, the first electrode and the fourth electrode are collector electrodes, the second electrode and the fifth electrode are emitter electrodes, and the third electrode and the sixth electrode are gate electrodes.

44. The bidirectional switch module according to claim 1, wherein the first semiconductor switch element and the second semiconductor switch element are comprised of bipolar transistors, the first electrode and the fourth electrode are collector electrodes, and the second electrode and the fifth electrode are emitter electrodes.

45. The bidirectional switch module according to claim 2, wherein the first semiconductor switch element and the second semiconductor switch element are comprised of bipolar transistors, the first electrode and the fourth electrode are collector electrodes, and the second electrode and the fifth electrode are emitter electrodes.

46. The bidirectional switch module according to claim 3, wherein the first semiconductor switch element and the second semiconductor switch element are comprised of bipolar transistors, the first electrode and the fourth electrode are collector electrodes, and the second electrode and the fifth electrode are emitter electrodes.

47. The bidirectional switch module according to claim 4, wherein the first semiconductor switch element and the second semiconductor switch element are comprised of bipolar transistors, the first electrode and the fourth electrode are collector electrodes, and the second electrode and the fifth electrode are emitter electrodes.

48. The bidirectional switch module according to claim 5, wherein the first semiconductor switch element and the second semiconductor switch element are comprised of bipolar transistors, the first electrode and the fourth electrode are collector electrodes, and the second electrode and the fifth electrode are emitter electrodes.

49. The bidirectional switch module according to claim 6, wherein the first semiconductor switch element and the second semiconductor switch element are comprised of bipolar transistors, the first electrode and the fourth electrode are collector electrodes, and the second electrode and the fifth electrode are emitter electrodes.

\* \* \* \* \*